United States Patent [19]

Terry

[11] Patent Number: 5,378,990
[45] Date of Patent: Jan. 3, 1995

[54] DYNAMIC FUSE TESTING DEVICE HAVING TEST PROBES AND FUSE CONDITION INDICATOR CARRIED ON PIVOTAL HEAD

[76] Inventor: Roger M. Terry, 900 Brush St., #451, Las Vegas, Nev. 89107

[21] Appl. No.: 138,416

[22] Filed: Oct. 18, 1993

[51] Int. Cl.⁶ .......................................... G01R 31/02
[52] U.S. Cl. ................................. 324/550; 324/149; 324/556; 340/638
[58] Field of Search ............... 324/507, 508, 537, 550, 324/555, 556, 133, 149, 158 P, 72.5, 754; 340/638, 654, 656

[56] References Cited

U.S. PATENT DOCUMENTS

| | | | |
|---|---|---|---|
| 1,636,707 | 7/1927 | Robinson et al. | 324/550 |
| 1,639,889 | 8/1927 | Humm | 324/556 X |
| 2,023,916 | 12/1935 | Dante | 324/550 |
| 2,036,077 | 3/1936 | Podell | 324/508 |
| 3,820,017 | 6/1974 | Reichenbach | 324/550 |
| 4,107,602 | 8/1978 | Evans | 324/550 |
| 4,525,664 | 6/1985 | Trammell, Jr. | 324/550 |

OTHER PUBLICATIONS

"Continuity Tester", Adsmond et al., vol. 8, No. 4, Sep. 1965.

Primary Examiner—Gerard R. Strecker
Assistant Examiner—Diep Do
Attorney, Agent, or Firm—John R. Flanagan

[57] ABSTRACT

A dynamic fuse testing device includes an elongated handle, a head pivotally mounted to the handle, a fastener for tightening the head relative to the handle to place the head and handle at a desired angular position relative to one another, a pair of elongated electrically conductive test probes for contacting opposite ends of a fuse, a pair of mounting members attached in spaced relation to one another on the head, the mounting members having respective outer ends mounting the respective probes, one of the mounting members being stationarily mounted on the head and the other of the mounting member being rotatably mounted on the head such that its outer end is pivotally movable toward and away from the outer end of the one mounting member for adjusting the distance between the probes to accommodate fuses of different sizes, and a lamp and battery on the head connected in series with the probes such that the lamp is illuminated by contact of the probes with a properly functioning fuse.

20 Claims, 1 Drawing Sheet

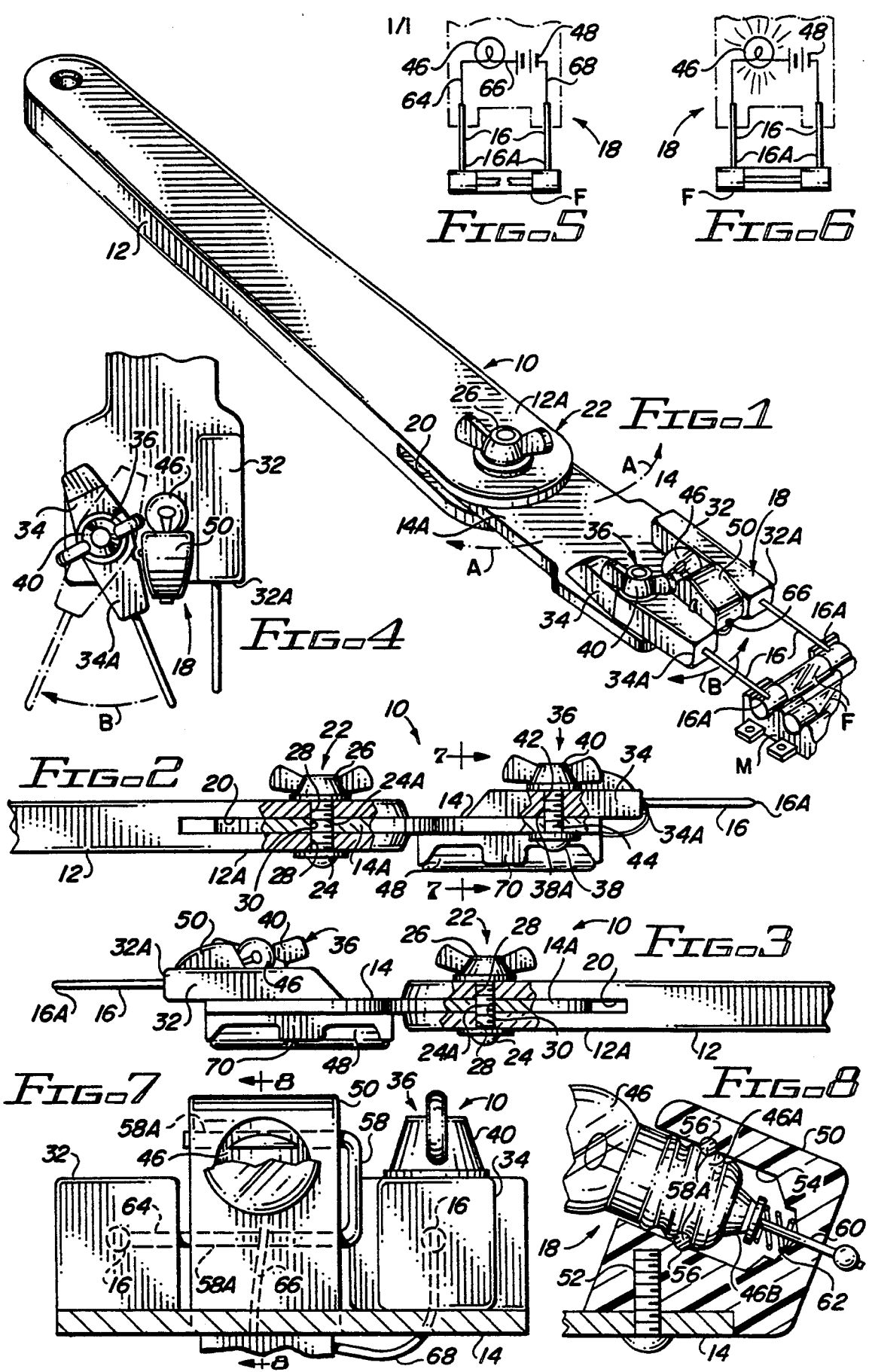

DYNAMIC FUSE TESTING DEVICE HAVING TEST PROBES AND FUSE CONDITION INDICATOR CARRIED ON PIVOTAL HEAD

BACKGROUND OF THE INVENTION

1. Field of the Invention

The present invention generally relates to devices for testing elements of electrical circuitry and, more particularly, is concerned with a dynamic fuse testing device.

1. Description of the Prior Art

Fuses have been used for many years to provide over current and short circuit protection for electrical circuits. Frequently, fuses are grouped and mounted in fuseblock assemblies. When one of the fuses burns out or blows, it must be identified from among the group of fuses before it can be replaced. Typically, the fuses are removed one at a time until the blown fuse if found.

There are many devices which have been proposed in the prior patent art to assist in identifying a blown fuse. Representative examples of such devices are the ones disclosed in U.S. Pat. Nos. to Dante (2,023,916), Reichenbach (3,820,017), Evans (4,107,602) and Trammell, Jr. (4,525,664). These devices typically employ one or two probes and indicator lights mounted on a handle. Some devices require two hands to operate. Others require only one hand. However, most devices fail to be sufficiently maneuverable to reach fuses in tight, difficult to reach locations.

Consequently, a need still exists for an improved device for reaching and testing fuses.

SUMMARY OF THE INVENTION

The present invention provides a dynamic fuse testing device designed to satisfy the aforementioned need. The fuse testing device of the present invention is self-contained, has no dangling wires to tangle with parts of the fuseblock and structures adjacent to the fuseblock, and has an elongated articulated handle and extension head capable of adjustment for easily reaching the fuseblock. The fuse testing device makes the checking of installed fuses very easy.

Accordingly, the present invention is directed to a dynamic fuse testing device which comprises: (a) an elongated handle; (b) a head pivotally mounted to the handle for movement between different angular positions relative to the handle; (c) a pair of electrically conductive elongated test probes mounted to the head and extending outwardly therefrom for contacting opposite ends of a fuse; and (d) means on the head electrically connected with the probes for providing an indication of the condition of the fuse.

Also, the fuse testing device includes means in the form of a fastener interconnecting the head and handle and being operable to tighten the head relative to the handle to place the head and handle at a desired angular position relative to one another. The fuse testing device further includes a pair of mounting members mounted in spaced relation to one another on the head. The mounting members have respective outer ends mounting the respective probes. One of the mounting members is stationarily mounted on the head. The other of the mounting members is rotatably mounted on the head such that the outer end of the other mounting member is pivotally movable toward and away from the outer end of the one mounting member for adjusting the distance between the probes to thereby accommodate fuses of different sizes.

More particularly, the fuse condition indication providing means includes a light element or lamp, a socket body mounted on the head and having a cavity for receiving and seating the lamp therein, and a battery mounted on the head. The indication providing means also includes a pair of channels defined in the socket body which intersect with the cavity, a first electrical connector inserted in the channels of the socket body and making electrical contact with a portion the lamp, a second electrical connector mounted at an end of the socket body and making contact with another portion of the lamp, and electrical circuit defining means extending between and electrically connecting the first and second electrical connectors, lamp, battery and probes in a series relationship such that the lamp is illuminated by a properly functioning fuse. Also, the battery is mounted on a first side of the head and the lamp is mounted on a second side of the head being opposite to the first side and at a location between the probe mounting members.

These and other features and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the following detailed description, reference will be made to the attached drawings in which:

FIG. 1 is a perspective view of the dynamic fuse testing device of the present invention.

FIG. 2 is an enlarged fragmentary side elevational view, with portions broken away and sectioned, of the device of FIG. 1.

FIG. 3 is a view similar to that of FIG. 2 but as seen from an opposite side of the device of FIG. 1.

FIG. 4 is an enlarged fragmentary top plan view of the pivotal head of the device.

FIG. 5 is a diagrammatic view of the electrical components of the device shown indicating a defective fuse.

FIG. 6 is a diagrammatic view of the electrical components of the device shown indicating a properly functioning fuse.

FIG. 7 is an enlarged transverse sectional view of the device taken along line 7—7 of FIG. 2.

FIG. 8 is a longitudinal sectional view of a socket body on the head of the device mounting a lamp, being taken along line 8—8 of FIG. 7.

DETAILED DESCRIPTION OF THE INVENTION

Referring to the drawings and particularly to FIGS. 1 to 4, there is illustrated a dynamic fuse testing device, generally designated 10, of the present invention capable of adjustment for easily reaching a fuseblock M for the testing and checking of fuses F while installed in the fuseblock. Therefore, the device 10 eliminates the need to first have to remove the fuse F from the fuseblock before it can be tested.

Basically, the fuse testing device 10 includes an elongated handle 12, a head 14, a pair of electrically conductive test probes 16, and a fuse condition indication providing arrangement 18. The handle 12 and head 14 have generally flat shapes with the head 14 being of shorter length than the handle 12, although other shapes and lengths can be provided. An end portion 14A of the head 14 is mounted within a slot 20 defined by a bifurcated end portion 12A of the handle 12.

The fuse testing device 10 also includes a first fastener 22 in the form of a bolt 24 and wing nut 26. The bolt 24 and wing nut 26 are adapted to pivotally interconnect the head 14 with the handle 12 so as to permit pivotal movement of the head 14 relative to the handle 12, as shown by the arrows A in FIG. 1, in order to infinitely adjust the head 14 to any selected one of a plurality of different angular positions relative to the handle 12. An elongated stem 24A of the bolt 24 extends through aligned apertures 28, 30 defined in the respective end portions 12A, 14A of the handle and head 12, 14. The wing nut 26 can be adjustably threadably loosened or tightened on a threaded end of the stem 24A of the bolt 24 to correspondingly permit adjustably pivotal movement of the head 14 relative to the handle 12 or retain the head 14 at the selected angular position where it was placed relative to the handle 12.

Referring to FIGS. 1-4, 7 and 8, the fuse test device 10 also includes a pair of mounting members or lugs 32, 34 mounted in spaced relation to one another on an opposite end of the head 14. The mounting lugs 32, 34 have respective outer ends 32A, 34A. The elongated electrically conductive test probes 16 having needle-like configurations are mounted to the respective outer ends 32A, 34A of the mounting lugs 32, 34 and project or extend outwardly therefrom. One mounting lug 32 is stationarily mounted on the head 14, while the other mounting lug 34 is rotatably mounted by a second fastener 36 on the head 14.

The second fastener 36 is in the form of a bolt 38 and wing nut 40 and is adapted to pivotally connect the rotatable mounting lug 34 on the head 14 so as to permit pivotal movement of the rotatable mounting lug 34 and the other test probe 16 thereon relative to the stationary mounting lug 32 and one test probe 16 thereon. The bolt 38 has an elongated stem 38A which extends through aligned apertures 42, 44 defined in the pivotal mounting lug 34 and head 14. The wing nut 40 can be adjustably threadably loosened or tightened on a threaded end of the stem 38A of the bolt 38 to correspondingly permit adjustable pivotal movement of the rotatable mounting lug 34 relative to the stationary mounting lug 32 and the head 14 or retain the rotatable mounting lug 34 at the selected angular position where it was placed relative to the stationary mounting lug 32. Thus, the outer end 34A of the rotatable mounting lug 34 is pivotally movable toward and away from the outer end 32A of the stationary mounting lug 32 such that the one test probe 16 can be moved toward and away from the other test probe 16, as shown by the arrows B in FIG. 2, so as to correspondingly shorten or lengthen the distance between the tips 16A of test probes 16 in order to accommodate fuses F having different lengths.

Referring to FIGS. 1-8, the fuse condition indication providing arrangement 18 on the head 14 is electrically connected with the probes 16 for providing an indication of a properly functioning fuse F. The fuse condition indication providing arrangement 18 includes a light element or lamp 46 and a d.c. battery 48 mounted on the head 14 and being electrically connected in series with one another and with the test probes 16 such that the light element 46 is illuminated by a properly functioning fuse which is in an unshorted condition (see FIG. 6). The indication providing arrangement 18 also includes a socket body 50 mounted on the head 14 by a screw 52.

The socket body 50 has a cylindrical cavity 54 adapted to receive the light element 46 therein and a pair of channels 56 defined in the socket body 50 which intersect with the cavity 54.

The indication providing arrangement 18 further includes a first electrical connector 58 in the form of a generally U-shaped clip 58. The clip 58 has a pair of legs 58A inserted in the socket body 50 through the respective channels where the legs 58A make electrical contact with a conductive side portion 46A of the light element 46 and one of the legs 58A extends beyond the socket body 50 and is connected to one of the test probes 16, as seen in FIG. 7. The indication providing arrangement 18 still further includes a second electrical connector 60 being movably mounted through an end of the socket body 50 and being biased by a coil spring 62 into making contact with a conductive end portion 46B of the light element 46. Electrical circuit defining means in the form of conductor leads 64, 66 and 68 extend between and electrically connect the first and second electrical connectors 58, 60, the light element 46, the battery 48 and the test probes 16 in a series relationship such that the light element 46 will not be illuminated by a burnt out or shorted defective fuse F and will be illuminated by properly functioning fuse F, as respectively seen in FIGS. 5 and 6.

Referring to FIGS. 2 and 3, it will be seen that the battery 48 is removably mounted by a holder 70 on one side of the head 14 whereas the light element 46 is mounted by the socket body 50 on the opposite side of the head 14. Other arrangements, however, are possible.

It is thought that the present invention and its advantages will be understood from the foregoing description and it will be apparent that various changes may be made thereto without departing from its spirit and scope of the invention or sacrificing all of its material advantages, the form hereinbefore described being merely preferred or exemplary embodiment thereof.

I claim:

1. A dynamic fuse testing device, comprising:
   (a) an elongated handle;
   (b) a head;
   (c) means for pivotally mounting said head to said handle for movement to different angular positions relative to said handle;
   (d) a pair of elongated electrically conductive test probes for contacting opposite ends of a fuse, said test probes being mounted to said head and extending outwardly therefrom; and
   (e) means for providing an indication of the condition of the fuse, said indication providing means being mounted on said head and electrically connected with said probes.

2. The device of claim 1 wherein said means for pivotally mounting said head to said handle includes a fastener interconnecting said head and handle and being operable to tighten said head relative to said handle to place said head and handle at said desired angular position relative to one another.

3. The device of claim 1 further comprising:
   a pair of mounting members mounted in spaced relation to one another on said head, said mounting members having respective outer ends mounting said respective probes.

4. The device of claim 3 wherein one of said mounting members is stationarily mounted on said head.

5. The device of claim 4 wherein the other of said mounting members is rotatably mounted on said head such that said outer end of said other mounting member is pivotally movable toward and away from said outer end of said one mounting member for adjusting the distance between said probes to accommodate fuses of different sizes.

6. The device of claim 1 wherein said indication providing means includes a light element mounted on said head and being electrically connected in series with said probes.

7. The device of claim 6 wherein said indication providing means also includes a socket mounted on said head and having a cavity for receiving and seating said light element therein.

8. The device of claim 7 wherein said indication providing means further includes:
   a pair of channels defined in said socket which intersect with said cavity;
   a first electrical connector inserted in said channels of said socket and making electrical contact with a portion said light element;
   a second electrical connector mounted at an end of said socket and making contact with another portion of said light element; and
   electrical circuit defining means extending between and electrically connecting said first and second electrical connectors, said lamp, said battery and said probes in a series relationship such that said lamp is illuminated by a properly functioning fuse.

9. The device of claim 6 wherein said indication providing means also includes a battery mounted on said head and being electrically connected in series with said light element and said probes such that said light element is illuminated by a properly functioning fuse.

10. The device of claim 9 wherein said battery is mounted on a first side of said head and said light element is mounted on a second side of said head being opposite to said first side.

11. A dynamic fuse testing device, comprising:
   (a) an elongated handle;
   (b) a head;
   (c) means interconnecting said head and handle for pivotally mounting said head to said handle for movement to different angular positions relative to said handle, said interconnecting means also for adjustably tightening said head relative to said handle to place said head and handle at a desired one of said different angular positions relative to one another;
   (d) a pair of elongated electrically conductive test probes for contacting opposite ends of a fuse, said test probes being mounted to said head and extending outwardly therefrom; and
   (e) means for providing an indication of the condition of the fuses said indication providing means being mounted on said head and electrically connected with said probes, said indication providing means including a light element and a battery mounted on said head and being electrically connected in series with said probes such that said light element is illuminated by a properly functioning fuse.

12. The device of claim 11 further comprising:
   a pair of mounting members mounted in spaced relation to one another on said head, said mounting members having respective outer ends mounting said respective probes.

13. The device of claim 12 wherein said light element is mounted on said head between said mounting members.

14. The device of claim 12 wherein one of said mounting members is stationarily mounted on said head.

15. The device of claim 14 wherein the other of said mounting members is rotatably mounted on said head such that said outer end of said other mounting member is pivotally movable toward and away from said outer end of said one mounting member for adjusting the distance between said probes to accommodate fuses of different sizes.

16. The device of claim 11 wherein said indication providing means also includes a socket mounted on said head and having a cavity for receiving and seating said light element therein.

17. The device of claim 16 wherein said indication providing means further includes:
   a pair of channels defined in said socket which intersect with said cavity;
   a first electrical connector inserted in said channels of said socket and making electrical contact with a portion said light element;
   a second electrical connector mounted at an end of said socket and making contact with another portion of said light element; and
   electrical circuit defining means extending between and electrically connecting said first and second electrical connectors, said lamp, said battery and said probes in a series relationship such that said lamp is illuminated by a properly functioning fuse.

18. The device of claim 11 wherein said battery is mounted on a first side of said head and said light element is mounted on a second side of said head being opposite to said first side.

19. A dynamic fuse testing device, comprising:
   (a) an elongated handle;
   (b) a head;
   (c) a fastener interconnecting said head and handle for pivotally mounting said head to said handle for movement to different angular positions relative to said handle, said interconnecting means also for adjustably tightening said head relative to said handle to place said head and handle at a desired one of said different angular positions relative to one another;
   (d) a pair of elongated electrically conductive test probes for contacting opposite ends of a fuse;
   (e) a pair of mounting members mounted in spaced relation to one another on said head, said mounting members having respective outer ends mounting said respective probes, one of said mounting member being mounted in a stationary position on said head and the other of said mounting member being rotatably mounted on said head such that said outer end of said other mounting member is pivotally movable toward and away from said outer end of said one mounting member for adjusting the distance between said probes to accommodate fuses of different sizes; and
   (f) means for providing an indication of the condition of the fuse, said indication providing means being mounted on said head and electrically connected with said probes, said indication providing means including a light element and a battery mounted on said head and electrically connected in series with said probes such that said light element is illuminated by a properly functioning fuse.

20. The device of claim 19 wherein said battery is mounted on a first side of said head and said light element is mounted on a second side of said head being opposite to said first side.

* * * * *